United States Patent
Kaneko et al.

(10) Patent No.: US 12,385,158 B2
(45) Date of Patent: Aug. 12, 2025

(54) METHOD FOR MANUFACTURING A SEMICONDUCTOR SUBSTRATE BY FORMING A GROWTH LAYER ON AN UNDERLYING SUBSTRATE HAVING THROUGH HOLES

(71) Applicants: KWANSEI GAKUIN EDUCATIONAL FOUNDATION, Hyogo (JP); TOYOTA TSUSHO CORPORATION, Aichi (JP)

(72) Inventors: Tadaaki Kaneko, Sanda (JP); Daichi Dojima, Sanda (JP)

(73) Assignees: KWANSEI GAKUIN EDUCATIONAL FOUNDATION, Hyogo (JP); TOYOTA TSUSHO CORPORATION, Aichi (JP)

( * ) Notice: Subject to any disclaimer, the term of this patent is extended or adjusted under 35 U.S.C. 154(b) by 247 days.

(21) Appl. No.: 17/996,184

(22) PCT Filed: Mar. 30, 2021

(86) PCT No.: PCT/JP2021/013745
§ 371 (c)(1),
(2) Date: Oct. 13, 2022

(87) PCT Pub. No.: WO2021/210392
PCT Pub. Date: Oct. 21, 2021

(65) Prior Publication Data
US 2023/0193507 A1    Jun. 22, 2023

(30) Foreign Application Priority Data
Apr. 14, 2020    (JP) .................................. 2020-072549

(51) Int. Cl.
*C30B 23/04*    (2006.01)
*C30B 23/02*    (2006.01)
(Continued)

(52) U.S. Cl.
CPC .......... *C30B 23/025* (2013.01); *C30B 23/063* (2013.01); *C30B 29/403* (2013.01);
(Continued)

(58) Field of Classification Search
CPC ....... C30B 23/00; C30B 23/02; C30B 23/025; C30B 23/04; C30B 23/06; C30B 23/063;
(Continued)

(56) References Cited

U.S. PATENT DOCUMENTS

| 6,579,359 B1 | 6/2003 | Mynbaeva et al. |
| 2010/0147211 A1 | 6/2010 | Miyanaga et al. |

(Continued)

FOREIGN PATENT DOCUMENTS

| CN | 105023991 B | 2/2018 |
| JP | 2003-229623 A | 8/2003 |

(Continued)

OTHER PUBLICATIONS

EPO Communication and European Search Report issued in corresponding EP application No. 21788842.9 on Apr. 25, 2024 (8 pages).

(Continued)

*Primary Examiner* — Kenneth A Bratland, Jr.
(74) *Attorney, Agent, or Firm* — Calfee, Halter & Griswold LLP (57) ABSTRACT

An object of the present invention is to provide a novel technique capable of manufacturing a large-diameter semiconductor substrate. The present invention is a method for manufacturing a semiconductor substrate including a crystal growth step S30 of forming a growth layer 20 on an underlying substrate 10 having through holes 11. In addition, the present invention is a method for forming a growth layer 20 including the through hole formation step S10 of forming through holes 11 in the underlying substrate 10 before (Continued)

forming the growth layer 20 on a surface of the underlying substrate 10.

9 Claims, 10 Drawing Sheets

(51) Int. Cl.
    *C30B 23/06*     (2006.01)
    *C30B 29/40*     (2006.01)
    *H01L 21/02*     (2006.01)

(52) U.S. Cl.
    CPC .... *H01L 21/02378* (2013.01); *H01L 21/0254* (2013.01); *H01L 21/02647* (2013.01)

(58) Field of Classification Search
    CPC ....... C30B 23/066; C30B 29/00; C30B 29/10; C30B 29/40; C30B 29/403; H01L 21/02378; H01L 21/0254; H01L 21/02647
    USPC ........................ 117/84, 88, 94, 106, 937, 952
    See application file for complete search history.

(56) References Cited

U.S. PATENT DOCUMENTS

| | | | |
|---|---|---|---|
| 2010/0221539 A1 | 9/2010 | Mizuhara et al. | |
| 2010/0242833 A1* | 9/2010 | Satoh | C30B 23/025 117/84 |
| 2017/0073839 A1 | 3/2017 | Mori et al. | |
| 2019/0057865 A1 | 2/2019 | Oshima et al. | |
| 2019/0136409 A1* | 5/2019 | Kaneko | C30B 35/002 |
| 2023/0304186 A1* | 9/2023 | Kaneko | H01L 21/02378 |

FOREIGN PATENT DOCUMENTS

| | | | | |
|---|---|---|---|---|
| JP | 2007-055881 A | | 3/2007 | |
| JP | 2015131744 A | | 7/2015 | |
| JP | 2015-166293 A | | 9/2015 | |
| JP | 2016037426 A | * | 3/2016 | |
| JP | 2018-024578 A | | 2/2018 | |
| JP | 2019-026500 A | | 2/2019 | |
| WO | 2007/111219 A | | 10/2007 | |
| WO | WO-2016147786 A1 | * | 9/2016 | ............. C23C 16/01 |
| WO | WO-2017188381 A1 | * | 11/2017 | ............. C30B 23/02 |

OTHER PUBLICATIONS

Kamber et al., "Lateral epitaxial overgrowth of aluminum nitride on patterned silicon carbide substrates by hydride vapor phase epitaxy", Applied Physics Letter (2007), vol. 90, No. 12, pp. 122116-1-122116-3.

Lossy et al., "Gallium nitride powerbar transistors with via holes fabricated by laser ablation", Physica Status Solidi. C: Current Topics in Solid State Physics (2006), vol. 3, No. 3, pp. 482-485.

English translation of International Search Report from PCT/JP2021/013745 dated Jun. 22, 2021 (3 pages).

* cited by examiner

METHOD FOR MANUFACTURING A SEMICONDUCTOR SUBSTRATE BY FORMING A GROWTH LAYER ON AN UNDERLYING SUBSTRATE HAVING THROUGH HOLES

CROSS-REFERENCE TO RELATED APPLICATIONS

This application is a 371 of PCT Application No. PCT/JP2021/013745, filed on Mar. 30, 2021, which claims priority to Japanese Application No. 2020-072549, filed on Apr. 14, 2020, the contents of which are hereby incorporated by reference as if recited in their entirety.

TECHNICAL FIELD

The present invention relates to a method for manufacturing a semiconductor substrate, a semiconductor substrate, and a method for forming a growth layer.

BACKGROUND ART

In general, a semiconductor substrate is manufactured by crystal-growing a growth layer on an underlying substrate. However, a problem has been reported that it is difficult to obtain a semiconductor substrate having a large diameter depending on compositions of the semiconductor material to be crystal-grown.

Examples thereof include a case where AlN crystals are grown on an underlying substrate such as an aluminum nitride (AlN) substrate or a silicon carbide (SiC) substrate via a sublimation method. When the crystals are simply grown via the sublimation method, there is a region where the AlN crystals do not grow, so that there is a problem that it is difficult to obtain a semiconductor substrate having a large diameter and excellent crystallinity.

In response to such a problem, Patent Literature 1 describes a technique of "a method for growing AlN crystals on a seed crystal substrate arranged in a crystal growth chamber in a crystal growth vessel provided in a reaction vessel via a vapor phase growth method, the method characterized in supplying a carbon-containing gas into the crystal growth chamber during crystal growth".

CITATION LIST

Patent Literature

Patent Literature 1: JP 2007-55881 A

SUMMARY OF INVENTION

Technical Problem

An object of the present invention is to provide a novel technique capable of manufacturing a large-diameter semiconductor substrate.

Furthermore, another object of the present invention is to provide a novel technique capable of manufacturing a semiconductor substrate having a large diameter and excellent crystallinity.

Solution to Problem

The present invention that is intended to solve the problems described above is a method for manufacturing a semiconductor substrate including a crystal growth step of forming a growth layer on an underlying substrate having through holes.

In this way, by forming the growth layer on the underlying substrate having the through holes, a semiconductor substrate having a diameter equivalent to the diameter of the underlying substrate can be manufactured. Therefore, by adopting an underlying substrate having a large diameter, a semiconductor substrate having a large diameter can be obtained.

Note that the term "large diameter" in the present description means that a growth layer having a large area is obtained as compared with a case where the growth layer is formed on the underlying substrate having no through holes.

In a preferred mode of the present invention, the crystal growth step is a step of heating such that a temperature gradient is formed along a vertical direction of the underlying substrate.

In a preferred mode of the present invention, the crystal growth step is a step of disposing the underlying substrate and the source of the growth layer in such a way to face each other, and heating the underlying substrate and the source in such a way to form the temperature gradient therebetween.

In a preferred mode of the present invention, the crystal growth step includes a lateral growth step of growing the growth layer in a horizontal direction of the underlying substrate, and a longitudinal growth step of growing the growth layer in a vertical direction of the underlying substrate.

In a preferred mode of the present invention, a through hole formation step of forming through holes in the underlying substrate, and a strained layer removal step of removing a strained layer introduced in the through hole formation step are further included.

In a preferred mode of the present invention, the through hole formation step is a step of forming the through holes by irradiating the underlying substrate with a laser.

In a preferred mode of the present invention, the strained layer removal step is a step of removing the strained layer of the underlying substrate by heat treatment.

In a preferred mode of the present invention, the underlying substrate is silicon carbide, and the strained layer removal step is a step of etching the underlying substrate under a silicon atmosphere.

Furthermore, the present invention also relates to a method for forming a growth layer. In other words, the present invention that is intended to solve the problems described above is a method for forming a growth layer including the through hole formation step of forming through holes in the underlying substrate before forming the growth layer on a surface of the underlying substrate.

In a preferred mode of the present invention, the strained layer removal step of removing a strained layer introduced in the through hole formation step is included.

In a preferred mode of the present invention, the strained layer removal step is a step of etching the underlying substrate by heat treatment.

Advantageous Effects of Invention

According to the technique disclosed, it is possible to provide a novel technique capable of manufacturing a large-diameter semiconductor substrate.

In addition, according to the technique disclosed, it is possible to provide a novel technique capable of manufacturing a semiconductor substrate having the large diameter and excellent crystallinity.

Other problems, features and advantages will become apparent by reading the following description of embodiments as well as understanding the drawings and claims.

DESCRIPTION OF EMBODIMENTS

Hereinafter, preferred embodiments of a method for manufacturing a semiconductor substrate according to the present invention will be described in detail with reference to the accompanying drawings. The technical scope of the present invention is not limited to the embodiments illustrated in the accompanying drawings, and can be appropriately changed within the scope described in the claims. Furthermore, the accompanying drawings are conceptual diagrams, and the relative dimensions and the like of each member do not limit the present invention. Moreover, in the present description, for the purpose of describing the invention, upper side or lower side may be referred to as the upper or the lower side based on the upper and lower sides of the drawings, but the upper and lower sides are not limited in relation to usage modes or the like of the semiconductor substrate of the present invention. In addition, in the following description of the embodiments and the accompanying drawings, the same reference numerals are given to the same configurations, and redundant description is omitted.

<<Method for Manufacturing Semiconductor Substrate>>

FIGS. 1 to 4 are explanatory views for explaining steps of the method for manufacturing a semiconductor substrate according to the embodiment of the present invention.

Figure 1:
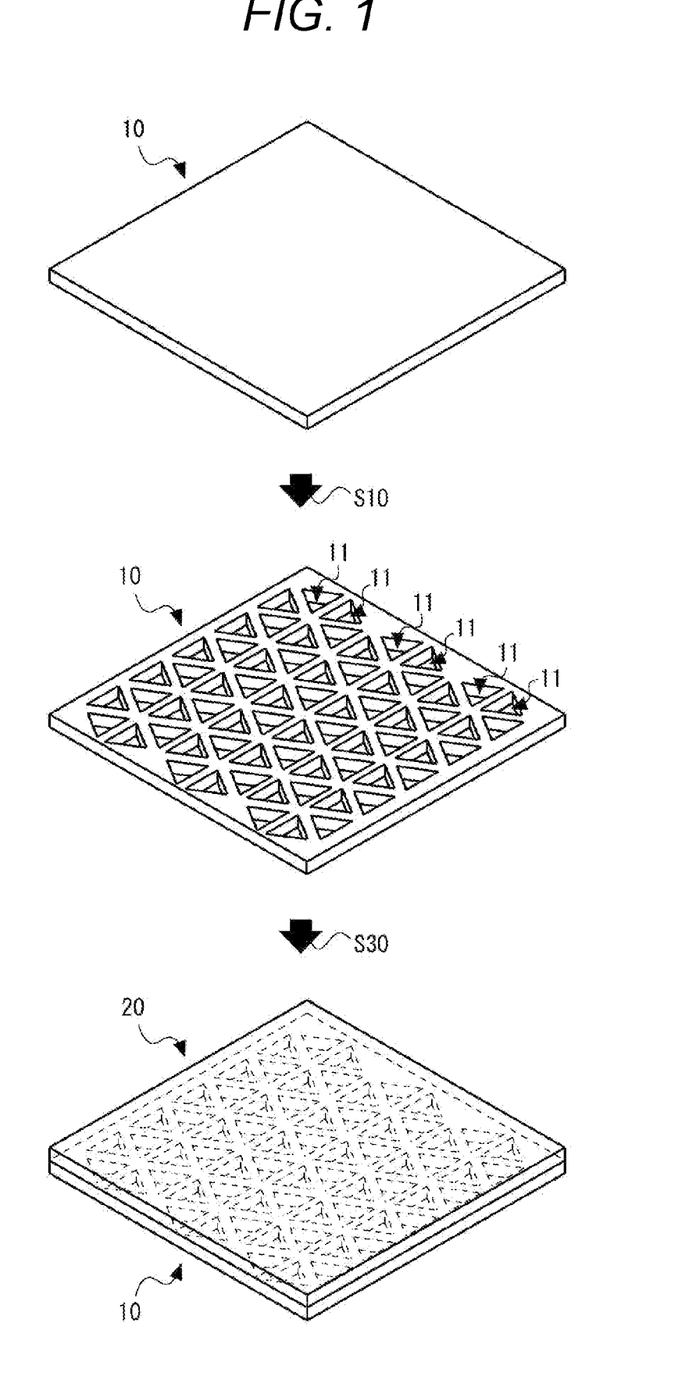
FIG. 1 is an explanatory view for explaining steps of a method for manufacturing a semiconductor substrate according to an embodiment.

The method for manufacturing the semiconductor substrate according to the embodiment may include a through hole formation step S10 of forming through holes 11 in an underlying substrate 10, a strained layer removal step S20 of removing a strained layer 12 introduced in the through hole formation step S10, and a crystal growth step S30 of forming a growth layer 20 in an underlying substrate 10 having the through holes 11.

In addition, this embodiment can be understood as a method of forming the growth layer 20 in a large area that includes the through hole formation step S10 of forming the through holes 11 in the underlying substrate 10 before forming the growth layer 20 on the surface of the underlying substrate 10.

Hereinafter, each step of the embodiment will be described in detail.

<Through Hole Formation Step>

The through hole formation step S10 is a step of forming the through holes 11 in the underlying substrate 10. The through hole formation step S10 can be naturally adopted as long as it is a method capable of forming the through holes 11 in the underlying substrate 10.

Figure 2:
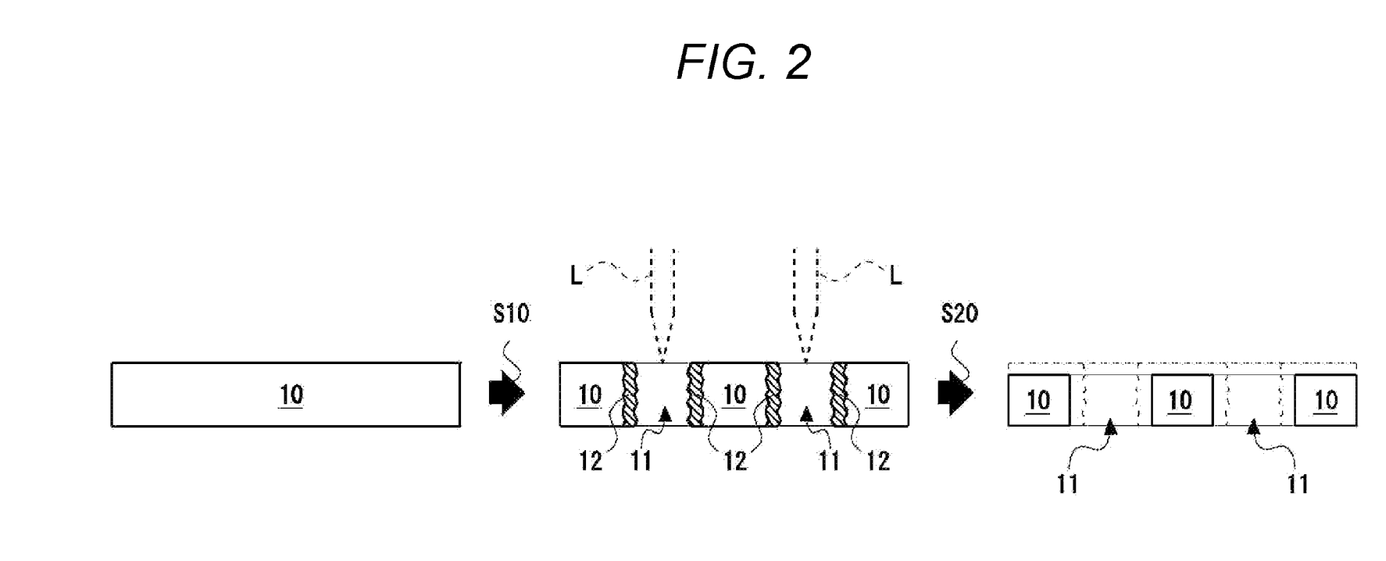
FIG. 2 is an explanatory view for explaining a through hole formation step and a strained layer removal step according to the embodiment.

As a method of forming the through holes 11, a plasma etching such as a laser processing, a focused ion beam system (FIB), and a reactive ion etching (RIE) can be adopted as an example. In addition, in FIG. 2 illustrating the present embodiment, a means for forming the through holes 11 by irradiating the underlying substrate 10 with a laser L is illustrated.

The underlying substrate 10 can be naturally adopted as long as it is a material generally used in manufacturing semiconductor substrates. The material of the underlying substrate 10 is, for example, a known group IV material such as silicon (Si), germanium (Ge), or diamond (C). Furthermore, the material of the underlying substrate 10 is, for example, a known group IV-IV compound material such as silicon carbide (SiC). Moreover, the material of the underlying substrate 10 is a known group II-VI compound material such as zinc oxide (ZnO), zinc sulfide (ZnS), zinc selenide (ZnSe), cadmium sulfide (CdS), or cadmium telluride (CdTe). The material of the underlying substrate 10 is, for example, a known group III-V compound material such as boron nitride (BN), gallium arsenide (GaAs), gallium nitride (GaN), aluminum nitride (AlN), indium nitride (InN), gallium phosphide (GaP), indium phosphide (InP), or indium antimonide (InSb). Furthermore, the material of the underlying substrate 10 is, for example, an oxide material such as aluminum oxide ($Al_2O_3$) or gallium oxide ($Ga_2O_3$). Moreover, the material of the underlying substrate 10 is, for example, a metal material such as copper (Cu) or nickel (Ni). Note that the underlying substrate 10 may have a configuration in which a known additive atom to be used according to the material is appropriately added.

In addition, as the underlying substrate 10, a wafer or a substrate processed from a bulk crystal may be used, or a substrate having a buffer layer made of the semiconductor material described above may be separately used.

Any shape suitable for the semiconductor material to be grown may be adopted for the through holes 11, and one or a plurality of through holes may be formed. In addition, a through hole group (pattern) in which a plurality of through holes 11 are arranged may be adopted.

Hereinafter, an example of a pattern when a hexagonal semiconductor material is grown will be described in detail.

Figure 3:
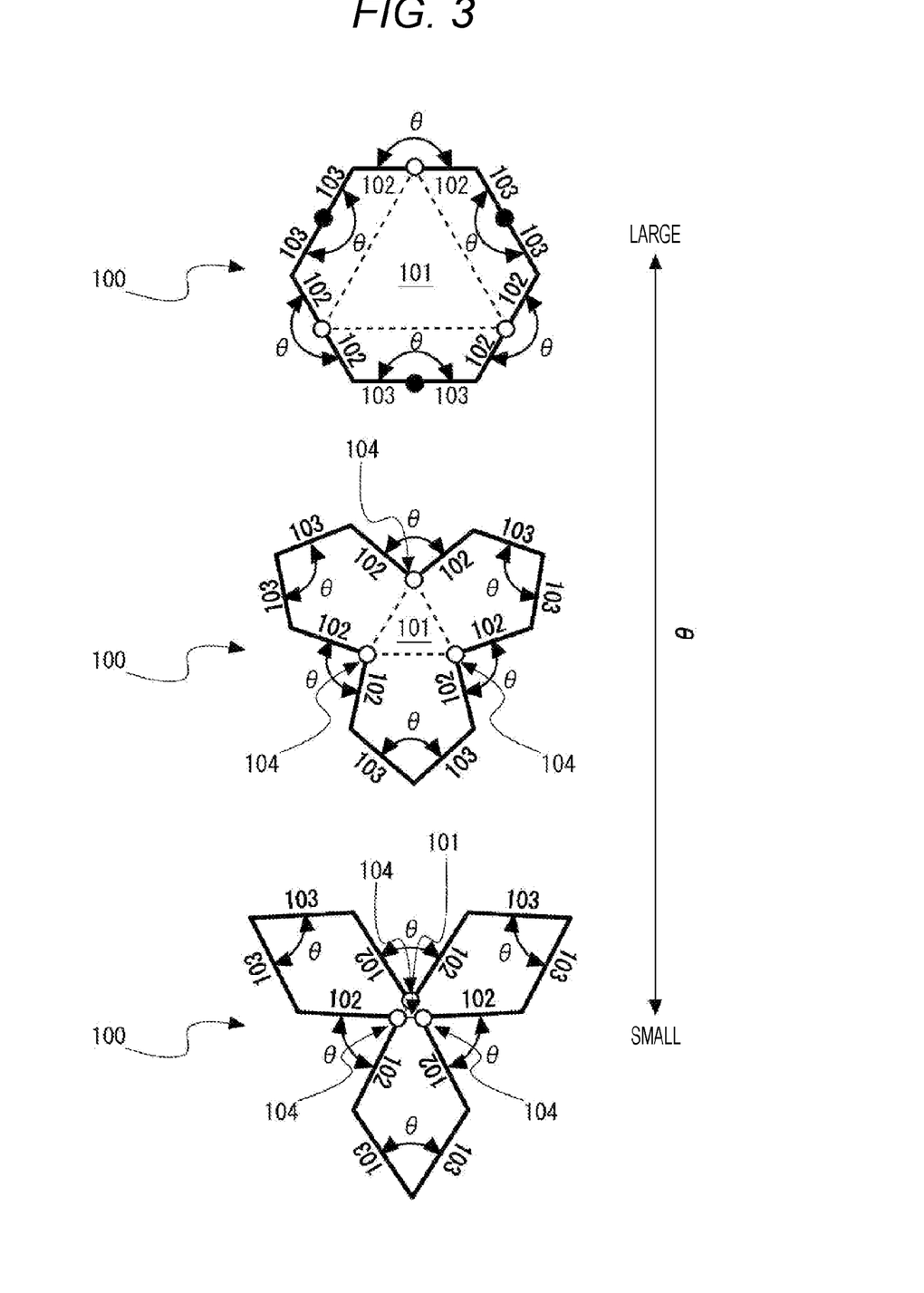
FIG. 3 is an explanatory view of the through hole formation step according to the embodiment.

FIG. 3 is an explanatory view for explaining a pattern 100 according to the embodiment. Aline segment indicated by the pattern 100 is the underlying substrate 10. The pattern 100 preferably presents a regular hexagonal displacement shape that is three-fold symmetric. The "regular hexagonal displacement shape" in the description of the present description will be described in detail below with reference to FIG. 3. The regular hexagonal displacement shape is a 12 polygon. Furthermore, the regular hexagonal displacement shape is constituted by 12 straight line segments having the same length. The pattern 100 having the regular hexagonal displacement shape includes a reference FIG. 101 which is regular triangle having an area 101a and including three vertices 104. Each of the three vertices 104 is included in the vertices of the pattern 100. Here, it can be understood that the three vertices 104 may be located on a line segment constituting the pattern 100. The pattern 100 includes line segments 102 (corresponding to first line segments) extending from the vertices 104 and including the vertices 104, and line segments 103 (corresponding to second line segments) not extending from the vertices 104, not including the vertices 104, and adjacent to the line segments 102. Here, an angle θ formed by two adjacent line segments 102 in the pattern 100 is constant and is equal to an angle θ formed by two adjacent line segments 103 in the pattern 100. Furthermore, the "regular hexagonal displacement shape" in the description of the present description can be understood as a 12 polygon in which the regular hexagon is displaced (deformed) while maintaining the area of the regular hexagon based on the angle θ indicating a degree of unevenness.

The angle θ is preferably more than 60°, preferably 66° or more, preferably 80° or more, preferably 83° or more, preferably 120° or more, preferably 150° or more, and preferably 155° or more. In addition, the angle θ is preferably 180° or less, preferably 155° or less, preferably 150° or less, preferably 120° or less, preferably 83° or less, preferably 80° or less, and preferably 66° or less.

The pattern 100 according to the embodiment may be configured to have a regular 12 polygonal displacement shape that is six-fold symmetric instead of the regular hexagonal displacement shape that is three-fold symmetric. The regular 12 polygonal displacement shape is a 24 polygon. Moreover, the regular 12 polygonal displacement shape is constituted by 24 straight line segments having the same length. The pattern 100 having the regular 12 polygonal displacement shape includes the reference FIG. 101 which is a regular hexagon having an area 101a and including six vertices 104. Each of the six vertices 104 is included in the vertices of the pattern 100. Moreover, similarly to the regular hexagonal displacement shape, an angle θ formed by two adjacent line segments 102 in the pattern 100 is constant and is equal to an angle θ formed by two adjacent line segments 103 in the pattern 100. In other words, the "regular 12 polygonal displacement shape" in the description of the present description can be understood as a 24 polygon in which the regular 12 polygon is displaced (deformed) while maintaining the area of the regular 12 polygon based on the angle θ indicating the degree of unevenness. In addition, the pattern 100 may have a 2n-gonal displacement shape that is a 4n-gonal shape in which a regular 2n-gonal shape is displaced (deformed) while maintaining the area of the regular 2n-gonal shape based on an angle θ indicating the degree of unevenness. At this time, it can be understood that the 2n-gonal displacement shape includes a regular n-gonal shape (corresponding to the reference FIG. 101). Here, it can be understood that the reference FIG. 101 includes n vertices.

The pattern 100 according to the embodiment may be configured to include a regular 2n-gonal displacement shape (the regular hexagonal displacement shape and the regular 12 polygonal displacement shape are included). Furthermore, the pattern 100 may be configured to further include at least one line segment (corresponding to a third line segment) connecting an intersection of two adjacent line segments 103 in the regular 2n-gonal displacement shape and the center of gravity of the reference FIG. 101, in addition to the line segment constituting the regular 2n-gonal displacement shape. Moreover, the pattern 100 may be configured to further include at least one line segment connecting an intersection of two adjacent line segments 103 in the regular 2n-gonal displacement shape and the vertices 104 constituting the reference FIG. 101, in addition to the line segment constituting the regular 2n-gonal displacement shape. In addition, the pattern 100 may further include at least one line segment constituting the reference FIG. 101 included in the regular 2n-gonal displacement shape, in addition to the line segment constituting the regular 2n-gonal displacement shape.

In addition, the through hole formation step S10 is preferably a step of removing 50% or more of an effective area of the underlying substrate 10. Furthermore, the step of removing 60% or more of the effective area is more preferable, the step of removing 70% or more of the effective area is further preferable, and the step of removing 80% or more of the effective area is still more preferable.

Moreover, the effective area in the present description refers to the surface of the underlying substrate 10 to which the source adheres in the crystal growth step S30. In other words, it refers to a remaining region other than a region removed by the through holes 11 on the growth surface of the underlying substrate 10.

Furthermore, the effective area of the underlying substrate 10 and the shape/pattern of the through holes 11 are desirably set in consideration of the lattice constant difference and the thermal expansion coefficient difference between the underlying substrate 10 and the growth layer 20, and a crystal structure and a growth method of the growth layer 20.

<Strained Layer Removal Step>

The strained layer removal step S20 is a step of removing the strained layer 12 formed on the underlying substrate 10 in the through hole formation step S10. As the strained layer removal step S20, a means for etching the underlying substrate 10 by heat treating the underlying substrate 10 can be exemplified.

In addition, any means capable of removing the strained layer 12 can be naturally adopted.

As a method of removing the strained layer 12, for example, a hydrogen etching method using hydrogen gas as an etching gas, a Si-vapor etching (SiVE) method of heating under a Si atmosphere, or an etching method described in Example 1 to be described later can be adopted.

<Crystal Growth Step>

The crystal growth step S30 is a step of forming the growth layer 20 on the underlying substrate 10 in which the through holes 11 are formed.

The semiconductor material of the growth layer 20 may be the same semiconductor material as that of the underlying substrate 10 (the homoepitaxial growth) or may be a semiconductor material different from that of the underlying substrate 10 (the heteroepitaxial growth).

As a material of the growth layer 20, in general, any material that is epitaxially grown as a semiconductor material can be naturally adopted. The material of the growth layer 20 may be the material of the underlying substrate 10, may be a known material that can be adopted for the material of the underlying substrate 10, or may be a known material that can be epitaxially grown on the underlying substrate 10.

As a material of the growth layer 20, for example, Si, Ge, GaN, AlN, InN, ZnS, ZnSe, CdTe, GaP, GaAs, InP, InAs, InSb, SiC, or the like can be adopted.

The combination of the material of the underlying substrate 10 and the material of the growth layer 20 can be appropriately selected in consideration of the difference in the lattice constant and the thermal expansion coefficient between both materials.

In the crystal growth step S30, as a growth method of the growth layer 20, a known vapor phase growth method (corresponding to a vapor phase epitaxial method) such as a physical vapor transport (PVT) method, a sublimation recrystallization method, an improved Rayleigh method, a chemical vapor transport (CVT) method, a molecular-organic vapor phase epitaxy (MOVPE) method, or a hydride vapor phase epitaxy (HVPE) method can be adopted. Furthermore, in the crystal growth step S30, a physical vapor deposition (PVD) method can be adopted instead of PVT. Moreover, in the crystal growth step S30, a chemical vapor deposition (CVD) method can be adopted instead of CVT. Then, in the crystal growth step S30, as a growth method of the growth layer 20, a known liquid phase growth method (corresponding to a liquid phase epitaxial method) such as a top-seeded solution growth (TSSG) method or a metastable solvent epitaxy (MSE) method can be adopted. In addition, in the crystal growth step S30, a Czochralski (CZ) method can be adopted as a growth method of the growth layer 20. In the crystal growth step S30, a growth method can be appropriately selected and adopted according to the respective materials of the underlying substrate 10 and the growth layer 20.

Figure 4:
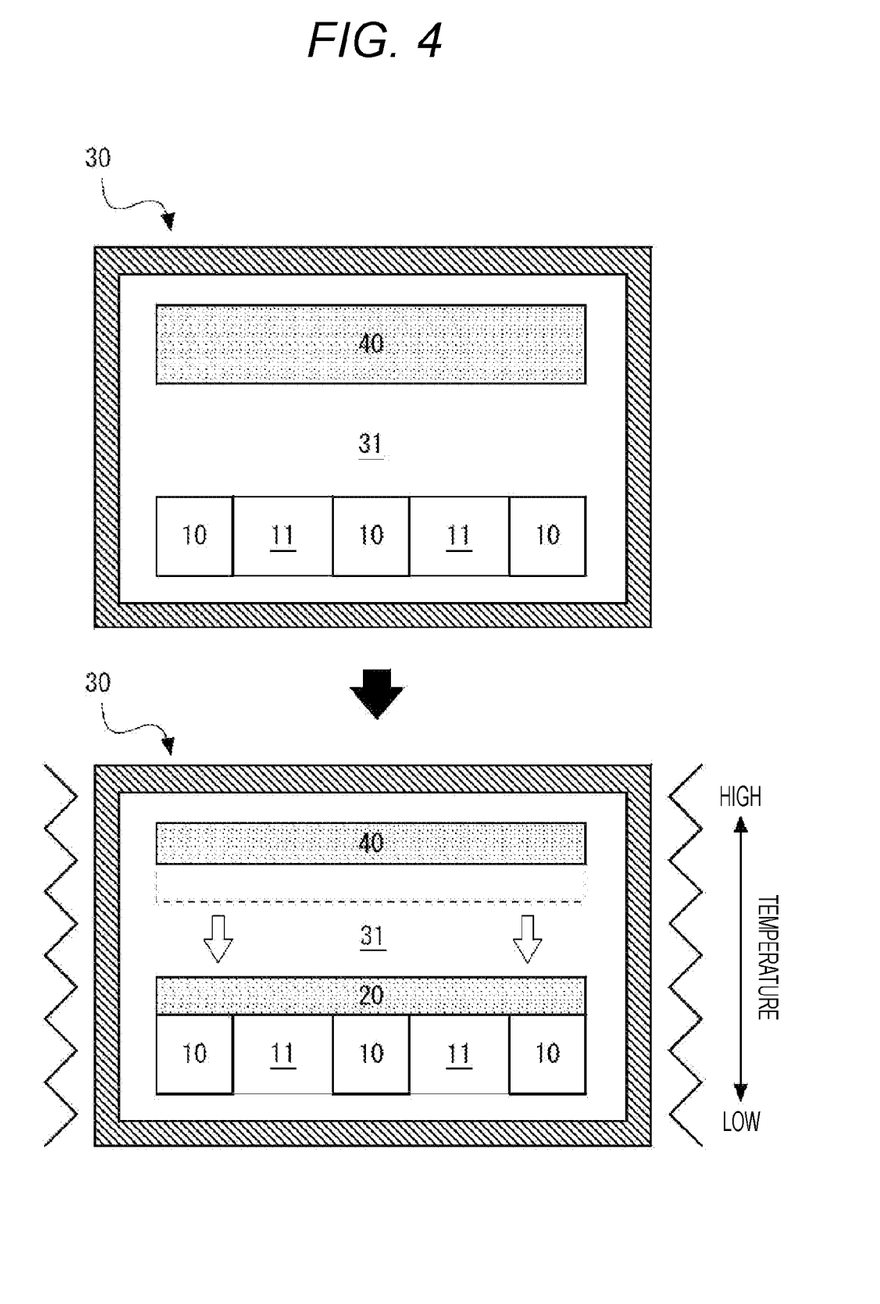
FIG. 4 is an explanatory view for explaining a crystal growth step according to the embodiment.
Figure 5:
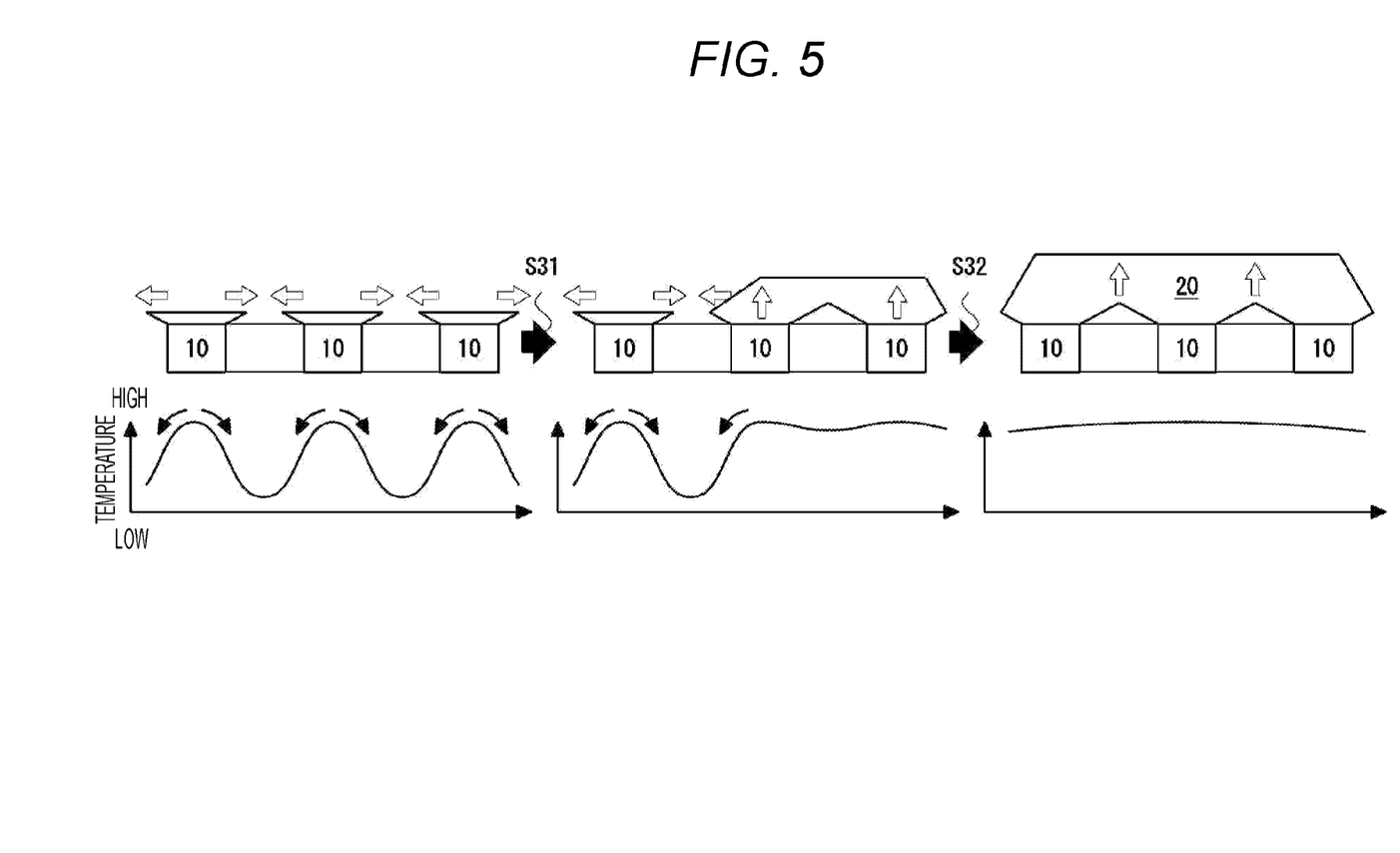
FIG. 5 is an explanatory view for explaining the crystal growth step according to the embodiment.

FIGS. 3 and 4 are explanatory views for explaining the crystal growth step S30 according to the embodiment.

The crystal growth step S30 according to the embodiment is a step in which the underlying substrate 10 and a semiconductor material 40 serving as a source of the growth layer 20 are disposed and heated in such a way as facing (confronting) each other in a crucible 30 having a quasi-closed space. Furthermore, the "quasi-closed space" in the present description refers to a space in which inside of the container can be evacuated but at least a part of the steam generated in the container can be confined.

Moreover, the crystal growth step S30 is a step of heating in such a way that the temperature gradient is formed along the vertical direction of the underlying substrate 10. By heating the crucible 30 (the underlying substrate 10 and the semiconductor material 40) in this temperature gradient, the source is transported from the semiconductor material 40 onto the underlying substrate 10 via a source transport space 31.

As a driving force for transporting the source, the temperature gradient described above and a chemical potential difference between the underlying substrate 10 and the semiconductor material 40 can be adopted.

Specifically, in the quasi-closed space, the vapor composed of an element sublimated from the semiconductor material 40 is transported by diffusing in the source transport space 31, and is supersaturated and condensed on the underlying substrate 10 set to have a temperature lower than that of the semiconductor material 40. As a result, the growth layer 20 is formed on the underlying substrate 10.

Furthermore, the crystal growth step S30 includes a lateral growth step S31 in which the growth layer 20 grows in the horizontal direction of the underlying substrate 10 and a longitudinal growth step S32 in which the growth layer 20 grows in the vertical direction of the underlying substrate 10.

Moreover, the lateral growth step S31 may include a growth component in the vertical direction (growth component: horizontal direction>vertical direction) as long as the growth component in the horizontal direction is larger than the growth component in the vertical direction.

In addition, in the longitudinal growth step S32, the growth component in the vertical direction may be larger than the growth component in the horizontal direction, and may include the growth component in the horizontal direction (growth component: vertical direction>horizontal direction).

In other words, as illustrated in FIG. 4, the lateral growth step S31 is a step in which the growth layer 20 grows toward the through holes 11 by the heat escaping from the through holes 11 of the underlying substrate 10 to form a temperature gradient in the horizontal direction on the surface of the underlying substrate 10.

Thereafter, when the growth layer 20 is formed on the through holes 11 in the lateral growth step S31, the temperature gradient in the horizontal direction decreases/disappears on the surface of the underlying substrate 10, and the process automatically proceeds to the longitudinal growth step S32.

In addition, in this crystal growth step S30, an inert gas or a doping gas may be introduced into the source transport space 31 to control a doping concentration and growth environment of the growth layer 20.

According to the present invention, a semiconductor substrate having a large diameter can be manufactured by crystal-growing the growth layer 20 on the underlying substrate 10 having the through holes 11. In other words, the heat escapes from the region where the through holes 11 are formed, so that a growth driving force acts in the horizontal direction of the underlying substrate 10. As a result, the bonding of the growth layer 20 is promoted on the region where the through holes 11 are formed, and the growth layer 20 having a diameter equivalent to the diameter of the underlying substrate 10 can be formed. Therefore, by adopting the underlying substrate 10 having a large diameter, a semiconductor substrate having a large diameter can be obtained.

Further, according to the present invention, the crystallinity of the growth layer 20 can be improved by forming the growth layer 20 on the region where the through holes 11 are formed. In other words, the growth layer 20 formed on the region where the through holes 11 are formed is not located immediately above the underlying substrate 10. Therefore, it is possible to reduce the dislocation of a threading system in the growth layer 20 without taking over the dislocation (for example, threading screw dislocations, threading edge dislocations, micropipes, and the like) of the threading system existing in the underlying substrate 10.

As one aspect of the method for manufacturing a semiconductor substrate according to the present invention, an aspect in which AlN is grown on a SiC substrate as shown in the following examples is exemplified.

In addition, as one aspect of the method for manufacturing a semiconductor substrate according to the present invention, an aspect not including an aspect of growing AlN on the SiC substrate can be exemplified.

EXAMPLES

The present invention will be described more specifically with reference to Example 1 and Comparative Example 1.

Furthermore, in Example 1 and Comparative Example 1, the semiconductor substrate was manufactured by growing the growth layer 20 of AlN on the underlying substrate 10 of SiC.

Example 1

<Through Hole Formation Step>
The underlying substrate 10 was irradiated with a laser under the following conditions to form the through holes 11.
(Underlying Substrate 10)
  Semiconductor material: 4H—SiC
  Substrate size: width 11 mm×length 11 mm×thickness 524 μm Growth surface: Si-face
Off angle: on-axis
(Laser Processing Conditions)
Type: green laser
Wavelength: 532 nm
Spot diameter: 40 μm
Average output: 4 W (at 30 kHz)
(Pattern Details)

Figure 6:
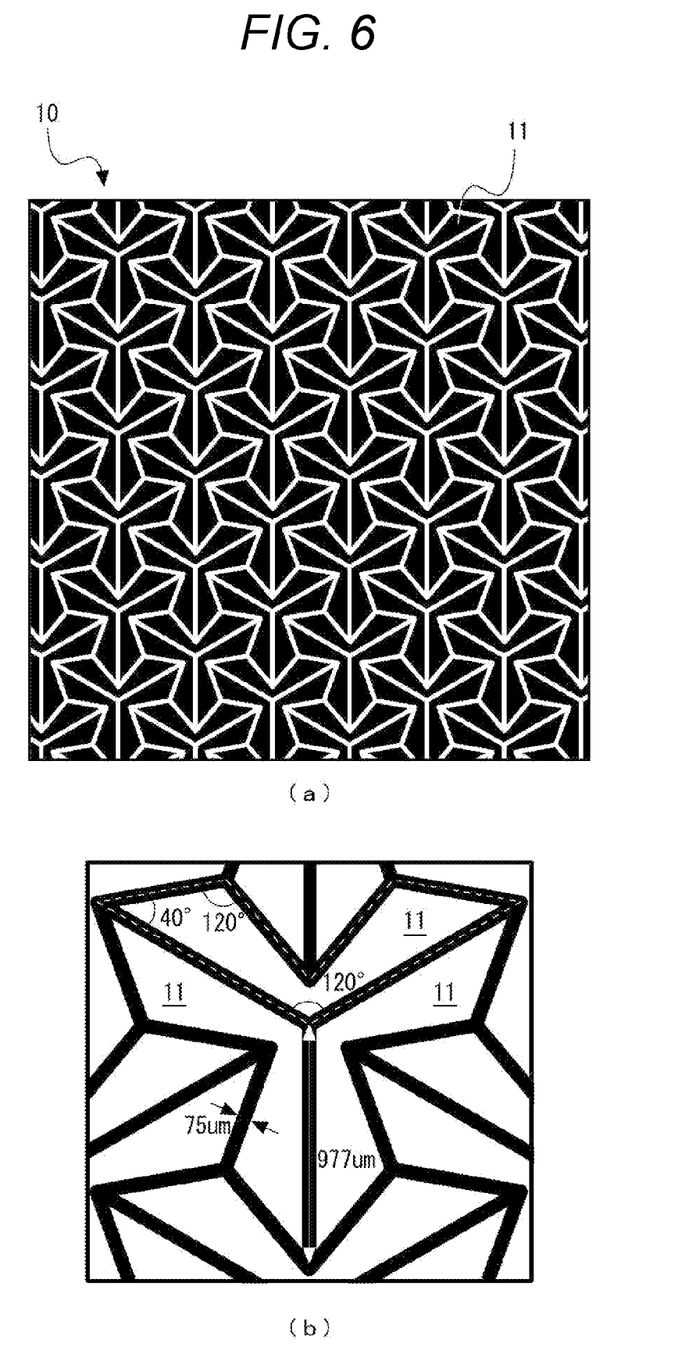
FIG. 6 is an explanatory view of a through hole formation step according to Example 1.

FIG. 6 is an explanatory view for explaining a pattern of the through holes 11 formed in the through hole formation step S10 according to Example 1. FIG. 6(a) is an explanatory view illustrating a state in which the plurality of through holes 11 is arranged. In FIG. 6(a), black regions indicate a portion of the through holes 11, and white regions remain as the underlying substrate 10.

FIG. 6(b) is an explanatory view illustrating a state in which the through holes 11 of FIG. 6(a) are enlarged. In FIG. 6(b), white regions indicate a portion of the through holes 11, and black regions remain as the underlying substrate 10.

Moreover, in the pattern of FIG. 6, 80% or more of the effective area of the underlying substrate 10 is removed to lower the strength of the underlying substrate 10.
(Strained Layer Removal Step S20)

Figure 7:
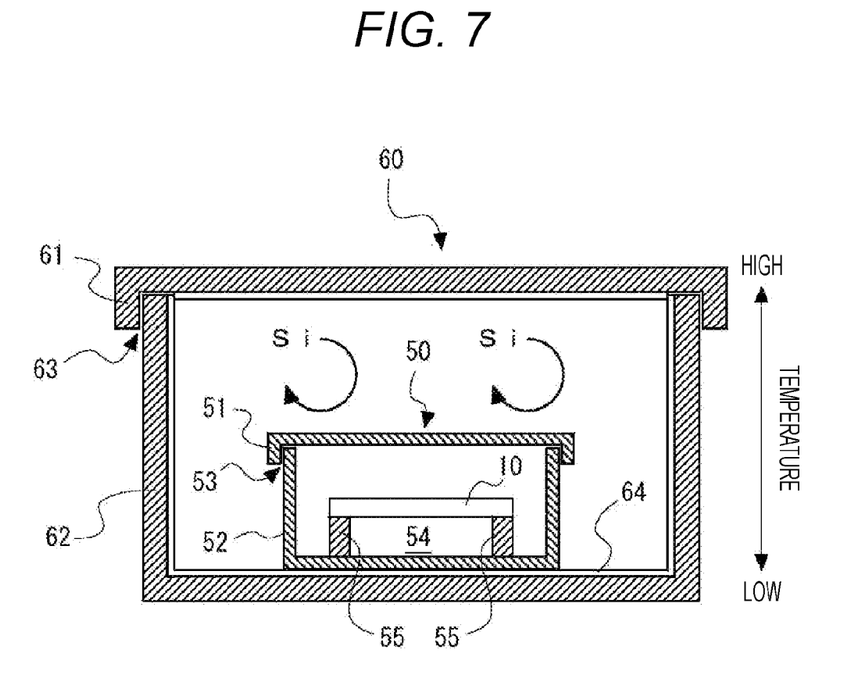
FIG. 7 is an explanatory view of a strained layer removal step according to Example 1.

FIG. 7 is an explanatory view for explaining the strained layer removal step S20 according to Example 1.

The underlying substrate 10 having the through holes 11 formed in the through hole formation step S10 was housed in a SiC container 50, the SiC container 50 was housed in a TaC container 60, and they were heated under the following conditions.
(Heating Conditions)
Heating temperature: 1800° C.
Heating time: 2 hours
Etching amount: 8 μm
(SiC Container 50)
Material: polycrystalline SiC
Container size: diameter 60 mm×height 4 mm
Distance between the underlying substrate 10 and bottom surface of the SiC container 50: 2 mm
(Details of SiC Container 50)

As illustrated in FIG. 7, the SiC container 50 is a fitting container including an upper container 51 and a lower container 52 that can be fitted to each other. A gap 53 is formed in a fitting portion between the upper container 51 and the lower container 52, and the SiC container 50 can be exhausted (evacuated) from the gap 53.

The SiC container 50 has an etching space 54 formed by making a part of the SiC container 50 arranged on the low temperature side of the temperature gradient face the underlying substrate 10 in a state where the underlying substrate 10 is arranged on the high temperature side of the temperature gradient. The etching space 54 is a space for transporting and etching Si atoms and C atoms from the underlying substrate 10 to the SiC container 50 using a temperature difference provided between the underlying substrate 10 and the bottom surface of the SiC container 50 as the driving force.

Furthermore, the SiC container 50 includes a substrate holder 55 that holds the underlying substrate 10 in a hollow state to form the etching space 54. In addition, the substrate holder 55 may not be provided depending on a direction of the temperature gradient of a heating furnace. For example, when the heating furnace forms a temperature gradient such that the temperature becomes lower from the lower container 52 toward the upper container 51, the underlying substrate 10 may be disposed on the bottom surface of the lower container 52 without providing the substrate holder 55.
(TaC Container 60)
Material: TaC
Container size: diameter 160 mm×height 60 mm
Si vapor supply source 64 (Si compound): TaSi$_2$
(Details of TaC Container 60)

Similarly to the SiC container 50, the TaC container 60 is a fitting container including an upper container 61 and a lower container 62 that can be fitted to each other, and is configured to be able to house the SiC container 50. A gap 63 is formed in a fitting portion between the upper container 61 and the lower container 62, and the TaC container 60 can be exhausted (evacuated) from the gap 63.

The TaC container 60 includes the Si vapor supply source 64 capable of supplying vapor pressure of a vapor phase type containing Si element into the TaC container 60. The Si vapor supply source 64 may be configured to generate vapor pressure of the vapor phase type containing Si element in the TaC container 60 during heat treatment.
<Crystal Growth Step S30>

Figure 8:
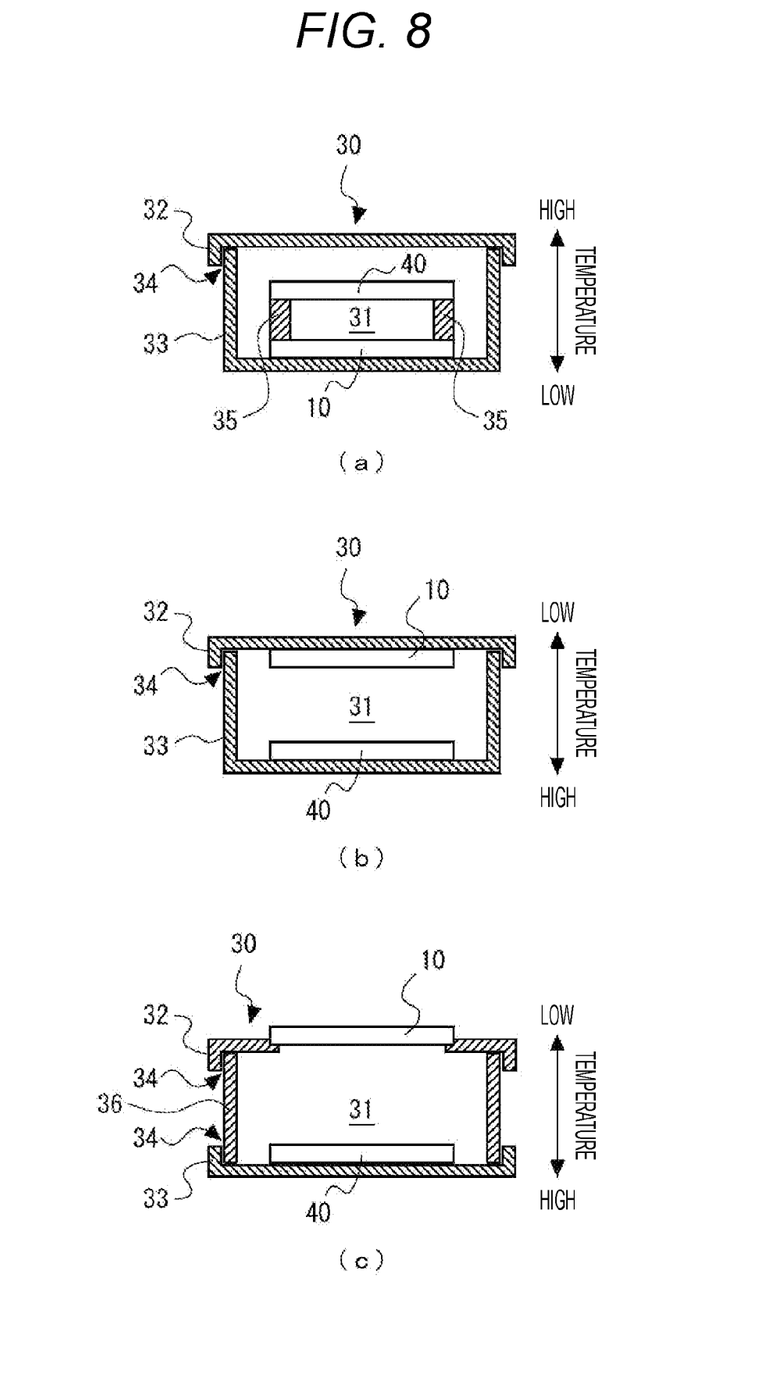
FIG. 8 is an explanatory view of a crystal growth step according to Example 1.

FIG. 8 is an explanatory view for explaining the crystal growth step S30 according to Example 1.

The underlying substrate 10 from which the strained layer 12 has been removed in the strained layer removal step S20 was housed in the crucible 30 while facing the semiconductor material 40, and was heated under the following conditions.
(Heating Conditions)
Heating temperature: 2040° C.
Heating time: 70 hours
Growth thickness: 500 μm
N$_2$ gas pressure: 10 kPa
(Crucible 30)
Material: tantalum carbide (TaC) and/or tungsten (W)
Container size: 10 mm×10 mm×1.5 mm
Distance between the underlying substrate 10 and the semiconductor material 40: 1 mm
(Details of Crucible 30)

The crucible 30 has a source transport space 31 between the underlying substrate 10 and the semiconductor material 40. The source is transported from the semiconductor material 40 onto the underlying substrate 10 through the source transport space 31.

FIG. 8(a) is an example of the crucible 30 to be used in the crystal growth step S30. Similarly to the SiC container 50 and the TaC container 60, the crucible 30 is a fitting container including an upper container 32 and a lower container 33 that can be fitted to each other. A gap 34 is formed in a fitting portion between the upper container 32 and the lower container 33, and the crucible 30 can be exhausted (evacuated) from the gap 34.

Further, the crucible 30 includes a substrate holder 35 that forms the source transport space 31. The substrate holder 35 is provided between the underlying substrate 10 and the semiconductor material 40, and forms the source transport space 31 by arranging the semiconductor material 40 on the high temperature side and the underlying substrate 10 on the low temperature side.

FIGS. 8(b) and 8(c) are another example of the crucible 30 to be used in the crystal growth step S30. The temperature gradient in FIGS. 8(b) and 8(c) is set opposite to the temperature gradient in FIG. 8(a), and the underlying substrate 10 is disposed on an upper side. In other words, similarly to FIG. 8(a), the semiconductor material 40 is disposed on the high temperature side, and the underlying substrate 10 is disposed on the low temperature side to form the source transport space 31.

FIG. 8(b) illustrates an example in which the underlying substrate 10 is fixed to the upper container 32 side to form the source transport space 31 with the semiconductor material 40.

FIG. 8(c) illustrates an example in which the source transport space 31 is formed between the semiconductor material 40 and the underlying substrate 10 by forming a through window in the upper container 32 and arranging the underlying substrate. Furthermore, as illustrated in FIG. 8(c), an intermediate member 36 may be provided between the upper container 32 and the lower container 33 to form the source transport space 31.

(Semiconductor Material 40)

Material: AlN sintered body
Size: width 20 mm×length 20 mm×thickness 5 mm (Details of Semiconductor Material 40)

The AlN sintered body of the semiconductor material 40 was sintered in the following procedure.

The AlN powder was placed in a frame of a TaC block and compacted with an appropriate force. Thereafter, the compacted AlN powder and the TaC block were housed in a thermal decomposition carbon crucible and heated under the following conditions.

Heating temperature: 1850° C.
$N_2$ gas pressure: 10 kPa
Heating time: 3 hours

Figure 9:
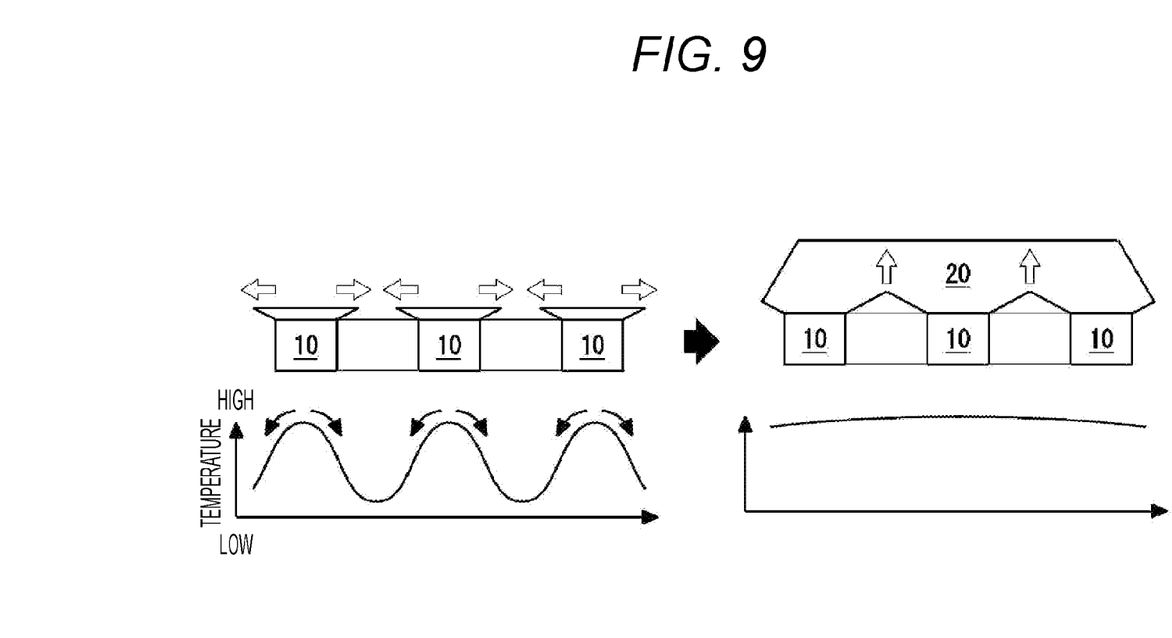
FIG. 9 is an explanatory view of the crystal growth step according to Example 1.

FIG. 9 is a schematic view showing a crystal growth step S30 of Example 1. By crystal-growing the growth layer 20 with respect to the underlying substrate 10 on which the through holes 11 are formed, the temperature gradient can be formed in the horizontal direction of the underlying substrate 10, and the temperature gradient can be used as the driving force for the lateral direction growth of the growth layer 20. In other words, even in the case of a semiconductor material such as AlN in which a crystal growth in the horizontal direction is difficult, the growth layer 20 can be formed on the region where the through holes 11 are formed, and a large-diameter semiconductor substrate can be manufactured.

Moreover, in the semiconductor substrate manufactured according to Example 1, no threading system dislocation was found in the growth layer 20 formed on the region where the through holes 11 are formed.

Comparative Example 1

In the underlying substrate 10 according to Comparative Example 1, a groove 13 was formed instead of the through holes 11 of Example 1. The underlying substrate 10 was subjected to the crystal growth step S30 under the same conditions as in Example 1. In other words, in Comparative Example 1, the crystal growth step S30 was performed without performing the through hole formation step S10.

Figure 10:
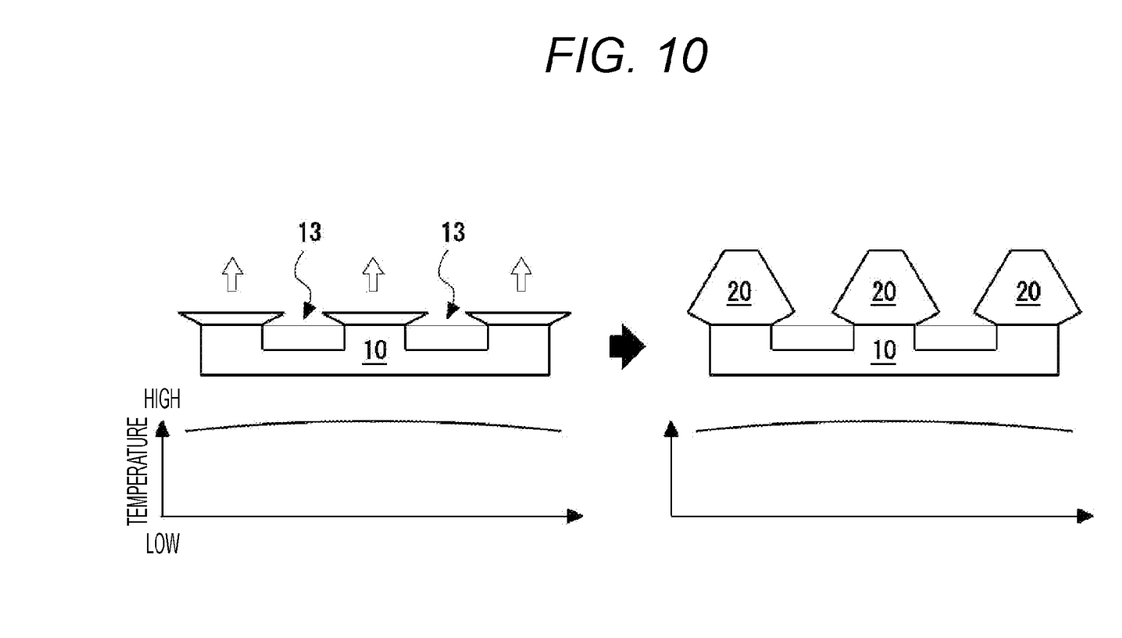
FIG. 10 is an explanatory view of a crystal growth step according to Comparative Example 1.

FIG. 10 is a schematic view showing the crystal growth step S30 of Comparative Example 1. In the semiconductor substrate manufactured according to Comparative Example 1, a region where the growth layer 20 did not grow was formed on the groove 13.

In other words, when the groove 13 was formed instead of the through holes 11, the temperature in the region of the groove 13 does not become lower, and the temperature gradient is not formed in the horizontal direction of the underlying substrate 10. As a result, it is considered that the growth driving force in the lateral direction is not generated and the growth layer 20 is not formed in the region of the groove 13.

From the results of Example 1 and Comparative Example 1, it can be understood that a large-diameter semiconductor substrate can be manufactured by forming the growth layer 20 on the underlying substrate 10 having the through holes 11.

10 Underlying substrate
11 Through hole
12 Strained layer
13 Groove
20 Growth layer
30 Crucible
31 Source transport space
40 Semiconductor material
50 SiC container
60 TaC container
S10 Through hole formation step
S20 Strained layer removal step
S30 Crystal growth step
S31 Lateral growth step
S32 Longitudinal growth step

The invention claimed is:

1. A method for manufacturing a semiconductor substrate, the method comprising
   a crystal growth step of forming a growth layer on an underlying substrate having through holes,
   wherein the underlying substrate is freestanding and the through holes allow airflow to pass through the underlying substrate;
   wherein the crystal growth step comprises disposing the underlying substrate and a source of the growth layer to face each other and heating the underlying substrate and the source of the growth layer in such a way that a temperature gradient is formed therebetween in which the underlying substrate is at a low temperature side and the source of the growth layer is at a high temperature side, and
   wherein a ratio of an area occupied by the through holes to a surface of the underlying substrate facing the source of the growth layer is 50% or more.

2. The method for manufacturing a semiconductor substrate according to claim 1, wherein the temperature gradient is formed along a vertical direction of the underlying substrate.

3. The method for manufacturing a semiconductor substrate according to claim 1, wherein the crystal growth step includes a lateral growth step of growing the growth layer in a horizontal direction of the underlying substrate, and a longitudinal growth step of growing the growth layer in a vertical direction of the underlying substrate.

4. The method for manufacturing a semiconductor substrate according to claim 1, wherein the method further comprising: a through hole formation step of forming through holes in the underlying substrate; and
   a strained layer removal step of removing a strained layer introduced in the through hole formation step.

5. The method for manufacturing a semiconductor substrate according to claim 4, wherein the through hole formation step is a step of forming the through holes by irradiating the underlying substrate with a laser.

6. The method for manufacturing a semiconductor substrate according to claim 4, wherein the strained layer removal step is a step of removing a strained layer of the underlying substrate by heat treatment.

7. The method for manufacturing a semiconductor substrate according to claim 4, wherein the underlying substrate is silicon carbide, and the strained layer removal step is a step of etching the underlying substrate under a silicon atmosphere.

8. The method for manufacturing a semiconductor substrate according to claim 5, wherein the strained layer removal step is a step of removing a strained layer of the underlying substrate by heat treatment.

9. The method for manufacturing a semiconductor substrate according to claim 1, wherein the ratio of the area occupied by the through holes to the surface of the underlying substrate facing the source of the growth layer is 80% or more.

* * * * *